(12) United States Patent
Kim et al.

(10) Patent No.: US 11,508,712 B2
(45) Date of Patent: *Nov. 22, 2022

(54) METHOD OF MANUFACTURING A PACKAGE-ON-PACKAGE TYPE SEMICONDUCTOR PACKAGE

(71) Applicant: Amkor Technology Singapore Holding Pte. Ltd., Singapore (SG)

(72) Inventors: Dong Jin Kim, Gwangju (KR); Jin Han Kim, Namyangju-si (KR); Se Woong Cha, Gwangju-si (KR); Ji Hun Lee, Gwangju-si (KR); Joon Dong Kim, Gwangju (KR); Yeong Beom Ko, Gwangju (KR)

(73) Assignee: AMKOR TECHNOLOGY SINGAPORE HOLDING PTE. LTD., Singapore (SG)

( * ) Notice: Subject to any disclaimer, the term of this patent is extended or adjusted under 35 U.S.C. 154(b) by 29 days.

This patent is subject to a terminal disclaimer.

(21) Appl. No.: 17/120,991

(22) Filed: Dec. 14, 2020

(65) Prior Publication Data

US 2021/0175222 A1    Jun. 10, 2021

Related U.S. Application Data

(63) Continuation of application No. 16/412,166, filed on May 14, 2019, now Pat. No. 10,867,984, which is a
(Continued)

(30) Foreign Application Priority Data

Aug. 19, 2014    (KR) .................. 10-2014-0107512

(51) Int. Cl.
*H01L 23/00*    (2006.01)
*H01L 25/00*    (2006.01)
(Continued)

(52) U.S. Cl.
CPC ............ *H01L 25/50* (2013.01); *H01L 21/561* (2013.01); *H01L 23/3128* (2013.01);
(Continued)

(58) Field of Classification Search
CPC ......... H01L 24/01; H01L 24/02; H01L 24/95; H01L 24/96; H01L 24/97; H01L 2224/01; H01L 2224/04105; H01L 2224/95
(Continued)

(56) References Cited

U.S. PATENT DOCUMENTS 5,201,451 A    4/1993    Desai
5,806,181 A    9/1998    Khandros et al.
(Continued)

FOREIGN PATENT DOCUMENTS

TW    201125073    7/2011
TW    20143845    4/2014
TW    1578490    4/2017

OTHER PUBLICATIONS

Redistributed Chip Package (RCP) Technology, Freescale Semiconductor, Inc., 2005, 6 pages.
(Continued)

*Primary Examiner* — Hoai V Pham
(74) *Attorney, Agent, or Firm* — McAndrews, Held & Malloy, Ltd.

(57) ABSTRACT

A method for manufacturing a semiconductor package, for example a package-on-package type semiconductor device package. As non-limiting examples, various aspects of this disclosure provide high-yield methods for manufacturing a package-on-package type semiconductor package, or a portion thereof.

20 Claims, 4 Drawing Sheets

Related U.S. Application Data continuation of application No. 15/683,065, filed on Aug. 22, 2017, now Pat. No. 10,290,621, which is a continuation of application No. 14/828,984, filed on Aug. 18, 2015, now Pat. No. 9,741,701.

(51) Int. Cl.
  *H01L 25/10* (2006.01)
  *H01L 23/31* (2006.01)
  *H01L 21/56* (2006.01)
  *H01L 23/498* (2006.01)
  *H01L 21/48* (2006.01)

(52) U.S. Cl.
  CPC .......... *H01L 25/105* (2013.01); *H01L 21/486* (2013.01); *H01L 21/568* (2013.01); *H01L 23/49811* (2013.01); *H01L 23/49816* (2013.01); *H01L 23/49827* (2013.01); *H01L 2224/16225* (2013.01); *H01L 2224/48091* (2013.01); *H01L 2224/48227* (2013.01); *H01L 2224/48465* (2013.01); *H01L 2224/97* (2013.01); *H01L 2924/15311* (2013.01); *H01L 2924/15331* (2013.01); *H01L 2924/181* (2013.01)

(58) Field of Classification Search
  USPC .......................................................... 438/110
  See application file for complete search history.

(56) References Cited

U.S. PATENT DOCUMENTS

| | | | |
|---|---|---|---|
| 5,829,128 A | 11/1998 | Eldridge et al. | |
| 5,832,601 A | 11/1998 | Eldridge et al. | |
| 5,852,870 A | 12/1998 | Freyman et al. | |
| 5,864,946 A | 2/1999 | Eldridge et al. | |
| 5,878,486 A | 3/1999 | Eldridge et al. | |
| 5,884,398 A | 3/1999 | Eldridge et al. | |
| 5,897,326 A | 4/1999 | Eldridge et al. | |
| 5,983,493 A | 11/1999 | Eldridge et al. | |
| 5,985,695 A | 11/1999 | Freyman et al. | |
| 5,998,228 A | 12/1999 | Eldridge et al. | |
| 6,032,356 A | 3/2000 | Eldridge et al. | |
| 6,124,637 A | 9/2000 | Freyman et al. | |
| 6,214,640 B1 | 4/2001 | Fosberry et al. | |
| 6,284,569 B1 | 9/2001 | Sheppard et al. | |
| 6,329,606 B1 | 12/2001 | Freyman et al. | |
| 6,492,203 B1 | 12/2002 | Wakashima et al. | |
| 6,655,023 B1 | 12/2003 | Eldridge et al. | |
| 6,741,085 B1 | 5/2004 | Khandros et al. | |
| 6,784,020 B2 | 8/2004 | Lee et al. | |
| 7,023,347 B2 | 4/2006 | Ameson et al. | |
| 7,140,883 B2 | 11/2006 | Khandros et al. | |
| 7,347,702 B2 | 3/2008 | Eldridge et al. | |
| 7,358,119 B2 | 4/2008 | McLellan et al. | |
| 7,538,438 B2 | 5/2009 | Yu et al. | |
| 7,683,380 B2 | 3/2010 | Lee et al. | |
| 7,696,006 B1 | 4/2010 | Hoang et al. | |
| 7,714,598 B2 | 5/2010 | Eldridge et al. | |
| 7,807,505 B2 | 10/2010 | Farnworth et al. | |
| 7,923,298 B2 | 4/2011 | Oliver et al. | |
| 7,985,621 B2 | 7/2011 | Chan et al. | |
| 8,106,492 B2 | 1/2012 | Chang et al. | |
| 8,124,447 B2 | 2/2012 | Chang et al. | |
| 8,367,475 B2 | 2/2013 | Law et al. | |
| 9,190,297 B2 | 11/2015 | Choi | |
| 9,484,227 B1 | 11/2016 | Cheng et al. | |
| 9,741,701 B2 * | 8/2017 | Kim ..................... H01L 25/105 |
| 2004/0020040 A1 | 2/2004 | Ameson et al. | |
| 2004/0087043 A1 | 5/2004 | Lee et al. | |
| 2004/0163252 A1 | 8/2004 | Khandros et al. | |
| 2005/0077611 A1 | 4/2005 | Ru | |
| 2006/0154403 A1 | 7/2006 | McLellan et al. | |
| 2006/0180595 A1 | 8/2006 | Ameson et al. | |
| 2007/0046313 A1 | 3/2007 | Eldridge et al. | |
| 2007/0075715 A1 | 4/2007 | Khandros et al. | |
| 2008/0057625 A1 | 3/2008 | Chan et al. | |
| 2008/0231305 A1 | 9/2008 | Khandros et al. | |
| 2008/0315220 A1 | 12/2008 | Lee et al. | |
| 2009/0091025 A1 | 4/2009 | Wong et al. | |
| 2009/0236686 A1 | 9/2009 | Shim, II | |
| 2009/0261466 A1 | 10/2009 | Pagaila et al. | |
| 2010/0258920 A1 | 10/2010 | Chien et al. | |
| 2010/0258934 A1 | 10/2010 | Chang et al. | |
| 2011/0068444 A1 | 3/2011 | Chi et al. | |
| 2011/0169150 A1 | 7/2011 | Su et al. | |
| 2011/0285007 A1 * | 11/2011 | Chi ........................ H01L 24/11 |
| | | | 257/E23.101 |
| 2013/0037936 A1 | 2/2013 | Choi et al. | |
| 2013/0299973 A1 | 11/2013 | Choi et al. | |
| 2014/0167263 A1 | 6/2014 | Wu et al. | |
| 2016/0056079 A1 | 2/2016 | Kim et al. | |

OTHER PUBLICATIONS

"Demand for Fan-Out Wafer-Level Packages Catch On", I-Micronews, available at <http://www.imicronews.com/analysis/Demand-Fan-Out-Wafer-Level-Packages-Catch-On,2950.html>, published on Apr. 8, 2009, retrieved on May 25, 2012, 4 pages.

Office Action for TW Application No. 110114652, dated Jan. 12, 2022, 10 pages.

* cited by examiner

METHOD OF MANUFACTURING A PACKAGE-ON-PACKAGE TYPE SEMICONDUCTOR PACKAGE

CROSS-REFERENCE TO RELATED APPLICATIONS/INCORPORATION BY REFERENCE

The present application is a continuation of U.S. patent application Ser. No. 16/412,166, filed on May 14, 2019, which is a continuation of U.S. patent application Ser. No. 15/683,065, filed on Aug. 22, 2017, now U.S. Pat. No. 10,290,621, which is a continuation of U.S. patent application Ser. No. 14/828,984, filed Aug. 18, 2015, now U.S. Pat. No. 9,741,701, which makes reference to, claims priority to, and claims the benefit of Korean Patent Application No. 10-2014-0107512, filed on Aug. 19, 2014 in the Korean Intellectual Property Office and titled "METHOD FOR MANUFACTURING PACKAGE-ON-PACKAGE TYPE PACKAGE," the contents of which are hereby incorporated herein by reference, in their entirety.

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND

Present methods for forming various semiconductor devices, for example including package-on-package type packages, are inadequate, for example resulting in low yield. Further limitations and disadvantages of conventional and traditional approaches will become apparent to one of skill in the art, through comparison of such approaches with the present disclosure as set forth in the remainder of the present application with reference to the drawings.

SUMMARY

Figure 1:
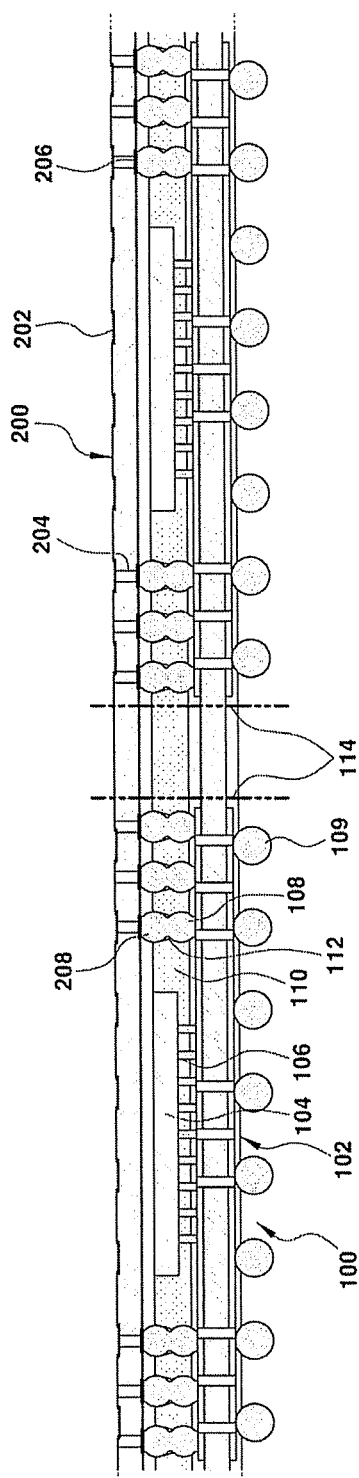
FIGS. 1-2 are diagrams showing an example package-on-package type package and manufacturing process thereof, in accordance with various aspects of the present disclosure.

Various aspects of this disclosure provide a method for manufacturing a semiconductor package, for example a package-on-package type semiconductor package. As non-limiting examples, various aspects of this disclosure provide high-yield methods for manufacturing a package-on-package type semiconductor package, or a portion thereof.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set $\{(x), (y), (x, y)\}$. In other words, "x and/or y" means "one or both of x and y." As another example, "x, y, and/or z" means any element of the seven-element set $\{(x), (y), (z), (x, y), (x, z), (y, z), (x, y, z)\}$. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure. Additionally, the term "on" will be utilized in the document to mean both "on" and "directly on" (e.g., with no intervening layer).

In the drawings, various dimensions (e.g., layer thickness, width, etc.) may be exaggerated for illustrative clarity. Additionally, like reference numbers are utilized to refer to like elements through the discussions of various examples.

Various aspects of the present disclosure provide a method of manufacturing a semiconductor device package (e.g., a so-called package-on-package (PoP) type package) and a resulting semiconductor device package, which can increase production yield for the package.

The present disclosure relates generally, but not exclusively, to a method for manufacturing a Package-on-Package (PoP) type semiconductor device package. For example, various aspects of the present disclosure relate to a method for manufacturing a novel PoP package in which a lower package is manufactured by selecting only boards (e.g., package substrates, interposers, etc.) and semiconductor dies (or chips) that are determined to be good (e.g., known-good) and, thereafter, for example, an interposer may be formed thereon. In various implementations, for example those utilizing a preformed interposer, the interposer may also be determined to be good prior to incorporating the interposer into the package.

The trend of various electronic devices such as, for example, weight reduction, miniaturization, high-speed operation, multi-functionalization, and high performance emphasizes high reliability for semiconductor devices utilized in the electronic devices. Hence, various structures of semiconductor packages such as, for example, a wafer level chip scale package, a multi-chip stacking package in which multiple chips (or dies) are attached to an interposer and mounted on a board, and a Package-on-Package (PoP) type package in which two or more packages are installed atop each other with an interposer therebetween, to name a few, have been developed.

Figure 2:
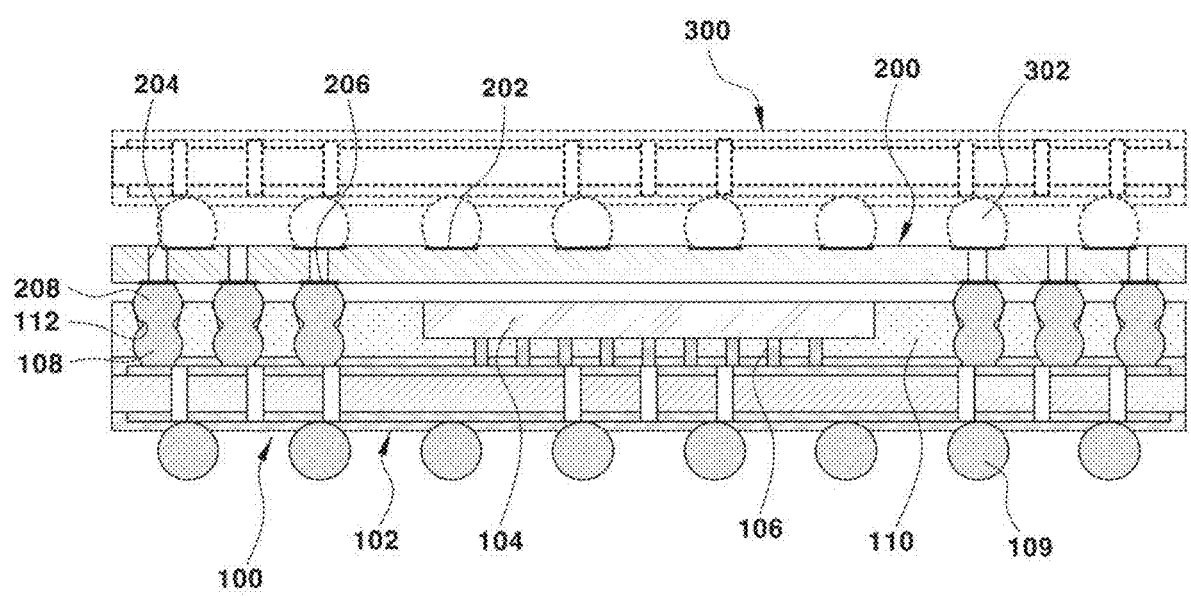

An example package configuration and manufacturing process of a Fan-in-PoP type package are provided in FIGS. 1-2. In particular, FIGS. 1-2 are diagrams showing an example package-on-package type package and manufacturing process thereof, in accordance with various aspects of the present disclosure. The package may, for example, comprise a fan-in type package.

First, to manufacture a lower semiconductor package 100, there is provided a strip-shaped printed circuit board 102 (or generally, a printed circuit board array) in which a plurality of semiconductor package manufacturing areas are equidistantly formed (or spaced) in transverse and/or longitudinal directions. Semiconductor dies 104 may, for example, be stacked on and attached to central portions of the respective semiconductor package manufacturing areas of the strip-board 102 via conductive bumps 106 (or other conductive structures) to enable electrical signal exchange. Though only a respective single die 104 (or chip) is shown attached to a respective board 102, a plurality of dies and/or passive electrical components may be attached.

Subsequently, stacking structures 108 (e.g., conductive balls, conductive pillars, conductive bumps, general interconnection structures utilized for providing electrical connections to stacked components, etc.) are fused to a conductive pattern that is formed in a peripheral region around each semiconductor die 104 (or group of electronic devices), which may also be referred to herein as a rim region of the strip-board 102. The stacking structures 108 may, for example, serve as means for electrical connection with an interposer 200.

Then, a step of encapsulating, or forming an encapsulating material 110 (e.g., molding a molding compound resin) over an upper surface of the board 102 may be implemented to encapsulate the semiconductor dies 104 and the stacking structures 108, for example for protection thereof. To enhance the outward radiation of heat generated in each semiconductor die 104, an upper surface of the encapsulating material 110 and an upper surface of the semiconductor die 104 may define the same plane such that the upper surface of the semiconductor die 104 is exposed outward from the encapsulating material 110.

After the encapsulating, a step of forming Through Mold Vias (TMVs) 112, or generally vias through the encapsulating material 110, having a predetermined depth in the upper surface of the encapsulating material 110 via laser processing or other ablation method may be implemented. For example, the depth of the through mold vias 112 may be determined to reveal the stacking structures 108.

Subsequently, a step of conductively stacking the interposer 200 on the through mold vias 112 of the lower semiconductor package 100 manufactured as described above is implemented.

The interposer 200 may, for example, be a general Printed Circuit Board (PCB), or may have a structure in which circuit wiring lines such as, for example, re-wiring lines are formed on the same silicon material as the semiconductor dies. For example, the interposer 200 may be formed, fully or in-part, utilizing a back end-of-line wafer manufacturing process. The interposer 200 may, for example, serve as a medium that conductively connects the lower semiconductor package 100 and an upper semiconductor package 300 to each other. In particular, the example interposer 200 shown in FIGS. 1-2 comprises a structure in which the re-wiring lines are formed in a desired direction to form conductive pads 202 at desired positions for connection with the upper semiconductor package 300.

For example, the interposer 200 may be configured in such a manner that the conductive pads 202 to be connected to input and output terminals 302 of the upper semiconductor package 300 (e.g., via conductive interconnection structures, for example conductive balls, leads, conductive bumps, pillars, etc.) are exposed from an upper surface of the interposer 200, and lands 206 (e.g., ball lands, or lands for coupling to any of a variety of types of interconnection structures) connected to the conductive pads 202 through via-holes 204 and/or the re-wiring lines (not illustrated) are formed at a lower surface of the interposer 200.

Connection structures 208 (e.g., conductive balls, conductive bumps, conductive pillars, etc.) are fused to the lands 206 of the interposer 200. As the connection structures 208 are stacked on and fused to the stacking structures 108 in the through mold vias 112 of the lower semiconductor package 100, electrical connection and stacking of the interposer 200 with respect to the lower semiconductor package 100 are accomplished.

Subsequently, as the input and output terminals 302 of the upper semiconductor package 300 are fused onto the conductive pads 202 of the interposer 200, stacking of the upper semiconductor package 300 is accomplished.

In an alternative example, instead of stacking the upper semiconductor package 300 on the conductive pads 202 of the interposer 200, a plurality of semiconductor dies (or chips) may be stacked on and attached to the conductive pads 202.

Subsequently, after interconnection structures 109 (e.g., conductive balls, solder balls, conductive pillars, conductive bumps, etc.) to be connected to, for example, a mother board of an electronic appliance (or device) are fused to respective lands exposed at a lower surface of the board 102 of the lower semiconductor package 100, the board 102 and the interposer 200 are subjected to sawing along or between sawing lines 114, completing an individual PoP type package, an example of which is illustrated in FIG. 2.

The Fan-in-PoP type package and/or method of manufacturing thereof, as shown in FIGS. 1-2, may for example comprise various opportunities for improvement. For example, a preformed strip-board may comprise individual boards that are defective. Even if, for example, defective individual boards of the strip-board are marked and not utilized, they consume valuable real estate during the manufacturing process and may be subject to various mass manufacturing processes (e.g., mass molding), thus wasting resources.

Accordingly, various aspects of the present disclosure provide for a reliable and efficient method of manufacturing a semiconductor device package (e.g., a PoP type package) and/or a package produced thereby. An example method may, for example, comprise selecting individual good-quality boards (or other substrates), for example by inspection, attaching the individual good-quality boards (otherwise referred to herein as known-good boards) to a carrier, and performing a series of PoP manufacturing processes including, for example, a die (or chip) attachment process, an encapsulating process, an encapsulant thinning process, and an interposer forming process for the individual good-quality boards, thereby preventing and/or reducing defects of the PoP package.

In accordance with various aspects of the present disclosure, an example method for manufacturing a semiconductor device package (e.g., a PoP type package) may comprise providing only good-quality individual boards by performing defect inspection on a strip-board including a plurality of individual boards and excising the known-good boards from the strip-board, attaching the known-good boards at a predetermined interval (or regular or consistent interval) to a carrier having a predetermined area, attaching a semiconductor die, judged as good quality (or known-good), to each individual known-good board via a conductive structure to enable electrical signal exchange, attaching a stacking terminal to a rim region of each individual known-good board corresponding to a peripheral region around the semiconductor die, molding a molding compound resin (or otherwise forming an encapsulant) having a predetermined thickness over an upper surface of the carrier to encapsulate each individual known-good board as well as the known-good semiconductor die and the stacking terminal, grinding or otherwise thinning an upper surface of the molding compound resin until an upper surface of the stacking terminal is exposed, forming an interposer on an upper surface of the molding compound resin, the interposer being conductively connected to the stacking terminal, and attaching input and output terminals to lands of each individual board after the carrier is removed.

The method may further, for example, comprise performing sawing along a sawing line between the respective individual known-good boards after stacking an upper semiconductor package on the interposer.

Forming the interposer may, for example, comprise conductively connecting a Printed Circuit Board (PCB) for the interposer to the stacking terminal and stacking the PCB on the upper surface of the molding compound resin. Also for example, the forming the interposer may include forming a rewiring line (or conductive trace) so as to extend to a desired position on the upper surface of the molding compound resin, the rewiring line being conductively connected to the stacking terminal.

The carrier may, for example, be formed in a predetermined thickness using reusable glass or silicon. Also for example, the stacking terminal may comprise a solder ball or a copper stud bump.

Figure 3:
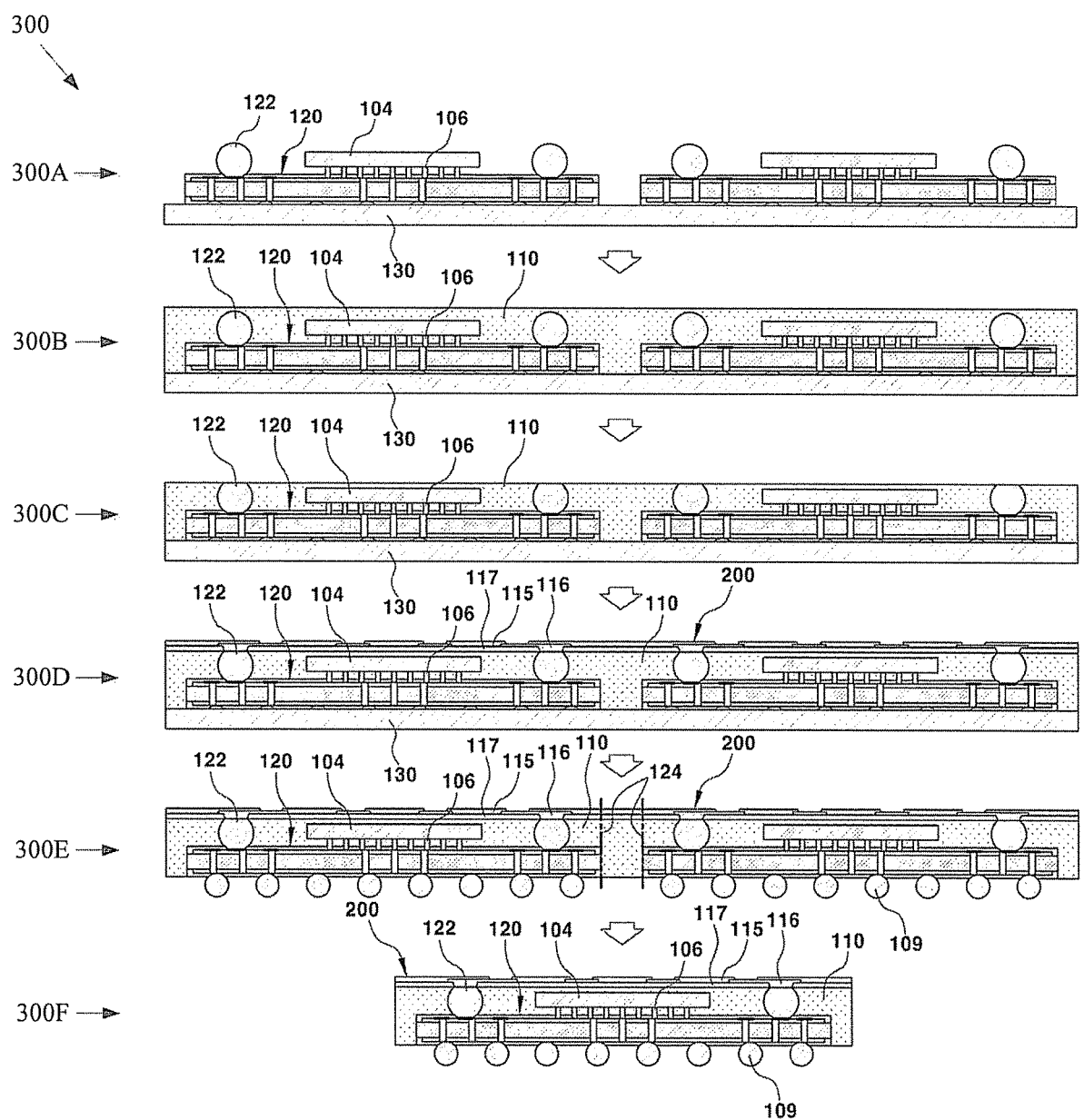
FIG. 3 is a diagram showing a series of cross-sectional views illustrating an example method of manufacturing a semiconductor package, in accordance with various aspects of the present disclosure.

Turning now to FIG. 3, such figure is a diagram showing a series of cross-sectional views illustrating an example method of manufacturing a semiconductor package, in accordance with various aspects of the present disclosure. The example methods (or any portion thereof) and/or example package structures (or components thereof) shown in FIG. 3 may, for example, share any or all characteristics with the example methods and packages shown in FIGS. 1-2 and discussed herein.

First, defect inspection may be performed on a strip-board (e.g., an array of printed circuit boards) or other collection of substrates, whether connected or not. Such boards may, for example, be utilized as package substrates for a semiconductor device package. Though the following discussion refers generally to the substrates as "boards," it should be understood that the scope of the present disclosure is not limited to printed wire boards. For example, the present disclosure also contemplates utilizing any of a variety of substrates (e.g., which may be utilized as a package substrate for a semiconductor device and/or as an interposer for a semiconductor device). Also, though the following discussion refers generally to a connected array of such boards as strip-boards, it should be understood that the scope of the present disclosure is not limited to an array of connected boards. For example, the present disclosure also contemplates any of a variety of collections of interconnected substrates (e.g., in a square or rectangular connected array, in a wafer-shaped connected array, etc.) and/or substrates that have been singulated prior to testing.

The defect inspection may be performed in any of a variety of manners, non-limiting examples of which are provided herein. For example, whether individual boards constituting the strip-board are good or defective respectively may be judged or determined by testing a circuit design region of the strip-board using test equipment such as a conventional vision system, an electrical test system, an x-ray inspection system, etc.

After defect inspection is performed on the strip-board, including for example the individual boards for semiconductor packaging, the strip-board is singulated (e.g., sawn, punched, snapped, etc.) into individual boards so that only good-quality individual boards 120 are provided to Package-on-Package (PoP) manufacturing processes.

As shown at cross-sectional view 300A, a carrier 130 having a predetermined area is provided as a support member for the PoP manufacturing processes of the present disclosure. The carrier 130 may comprise any of a variety of characteristics, non-limiting examples of which are provided herein. For example, the carrier 130 may comprise any of a variety of geometrical configurations (e.g., square, rectangular, circular, etc.) and/or thicknesses. Also, for example, the carrier 130 may comprise any of a variety of materials (e.g., glass, silicon or other semiconductor material, metal, etc.). For example, the carrier 130 may be formed of a material and handled, such that the carrier 130 may be reused after it is separated from the work product (e.g., after it is separated from a completed or nearly completed package or electrical component module).

An adhesive may, for example, be applied to the carrier 130. The adhesive may, for example, comprise any of a variety of characteristics, non-limiting examples of which are provided herein. The adhesive may, for example, comprise a double-sided adhesive tape, an adhesive paste, an adhesive spray, etc. The adhesive may, for example, comprise characteristics that provide for convenient removal of the adhesive (e.g., breaking the bond between the adhesive and the carrier 130, boards 120, encapsulating material 110, etc.), such that the carrier 130 may be non-destructively separated from the work product after use.

The known-good individual boards 120 may then be mounted to the carrier 130 utilizing the adhesive. For example, automated pick-and-place equipment may be utilized to place the boards 120 on the adhesive at precise locations (e.g., in a one-dimensional array, a two-dimensional array, etc.). The carrier-mounted boards 120 may, for example, be placed at regular intervals with no more space between the boards 120 than necessary to reduce waste (e.g., material waste, production time waste, etc.). For example, the carrier-mounted boards 120 may be mounted to the carrier 130 such that there is only enough unused space between completed packages to allow for a width of a singulation device (e.g., saw, punch, laser, etc.) utilized to separate completed or nearly completed packages.

After the known-good boards 120 are mounted to the carrier, semiconductor dies 104 (or chips) and/or other electrical components are attached to the boards 120. For example, one or more respective semiconductor dies 104 may be electrically and mechanically attached to each of the boards 120. The semiconductor die 104 and/or other electrical components may, for example, have been pre-tested (e.g., utilizing electrical testing, visual inspection, x-ray inspection, etc.) and determined to be of good quality (otherwise referred to herein as "known-good"). The semiconductor dies 104 may, for example, be attached to the boards 120 utilizing any of a variety of interconnection structures 106 (e.g., conductive bumps, conductive pillars, wafer-level bumps, conductive balls, solder, epoxy, etc.) to connect with respective lands of the boards 120.

For example, after the interconnection structures 106 are integrally connected to respective bonding pads of the semiconductor dies 104 using, for example, a conventional plating process, the interconnection structures 106 are fused to respective exposed conductive patterns in central regions of the respective individual boards 120 (e.g., in central regions or other regions of the boards 120 that are configured for attachment to the interconnection structures 106). Thereby, the semiconductor dies 104, for example judged as good quality, are conductively attached to the respective individual boards 120, for example also judged as good quality.

In an example implementation, the semiconductor dies 104 may be determined by selecting only those judged as good quality after the semiconductor dies 104 are tested, either while in wafer form and/or after singulation from a wafer.

In various example implementations, stacking terminals 122 may be formed in a rim region of each individual board 120 corresponding to a peripheral region around the semiconductor die 104, for example for conductive stacking of an upper semiconductor package or an interposer. The stacking terminals 122 may, for example, comprise any of a variety of characteristics. For example, the stacking terminals 122 may comprise conductive balls, solder balls, copper core solder balls, metallic stub bumps, copper stud bumps, conductive wires, conductive pillars, copper pillars, etc. The stacking terminals 122 may be formed in any of a variety of manners, non-limiting examples of which are provided herein. For example, the stacking terminals 122 may be formed by attaching preformed conductive structures (e.g., conductive balls, solder balls, conductive wires, etc.) to the boards 120. Also for example, the stacking terminals 122 may be built up on the boards 120 (e.g., by plating, printing, depositing, etc.).

The stacking terminals 122 formed on each individual board 120 may have a height equal to or greater than an upper surface of the semiconductor die 104. This may, for example, flexibly allow the stacking terminals 122 to be exposed after an encapsulant thinning process, while allowing the semiconductor dies 104 (or top surfaces thereof) to be exposed from the encapsulant or alternatively to be covered by the encapsulant.

Subsequently, as shown at diagram 300B, encapsulating may be performed. For example, an encapsulating material 110 may be formed over the carrier 130, the boards 120, the semiconductor dies 104, and/or the stacking terminals 122. The encapsulating material 110 may, for example, surround all or a portion of lateral surfaces of the boards 120, the semiconductor dies 104, and/or the stacking terminals 122. Though FIG. 3 shows the encapsulating material 110 formed over top surfaces of the stacking terminals 122 and over top surfaces of the semiconductor dies 104, any of such top surfaces need not be covered by the encapsulating (e.g., utilizing a film-assist or die-seal molding technique).

The encapsulating may be performed in any of a variety of manners, non-limiting examples of which are provided herein. For example, the encapsulating may comprise utilizing compression molding (e.g., utilizing liquid, powder and/or film) or vacuum molding. Also for example, the encapsulating may comprise utilizing a transfer molding process (e.g., a wafer-level transfer molding process). The encapsulating material may, for example, comprise any of a variety of characteristics. For example, the encapsulating material (e.g., epoxy mold compound (EMC), epoxy resin molding compound, etc.) may comprise a relatively high modulus, for example to provide structural support in a subsequent process, for example after the carrier 130 is removed. Alternatively for example, the encapsulating material may comprise a relatively low modulus, to provide wafer flexibility in a subsequent process when such flexibility is advantageous.

The encapsulating process may, for example, also provide an underfill between the semiconductor dies 104 and the boards 120. Note however, that such underfilling may also be performed before the encapsulating process, for example utilizing a different material than that utilized for the encapsulating process. In an example scenario in which underfilling is performed separately from the encapsulating process, such underfilling may be performed in any of a variety of matters (e.g., capillary underfilling, utilizing pre-applied underfill during the attaching of the semiconductor dies 104, etc.).

As shown at diagram 300C, following the encapsulating, an upper surface of the encapsulating material 110 may be thinned (e.g., if it is desired to expose top surfaces of the stacking terminals 122 and/or semiconductor dies 104 that were covered during the encapsulating). For example, the encapsulating material 110 may be thinned (e.g., by grinding, etc.) to expose upper surfaces of the stacking terminals 122. Also for example, the encapsulating material 110 may be thinned to expose at least top surfaces of the semiconductor dies 104. In an example implementation in which the stacking terminals 122 and/or semiconductor dies 104 are already exposed as desired, the thinning process may be skipped.

For example, in an example implementation only the upper surfaces of the stacking terminals 122 are exposed from the encapsulating material 110 (e.g., providing for a stacking connection with an upper semiconductor package, component, interposer, etc.). Alternatively, in another example implementation, the upper surfaces of the stacking terminals 122 and the upper surfaces of the semiconductor dies 104 are exposed from the encapsulating material 110 (e.g., to enhance heat transfer from the semiconductor dies 104, in addition for providing for a stacking connection).

At this point, production of the lower semiconductor package 100 on the carrier 130 may be completed.

After the lower semiconductor package 100 is formed on the carrier 130, an interposer 200 may be formed on the semiconductor package 100 (e.g., on each of the plurality of semiconductor packages 100), conductively connected to the stacking terminals 122. For example, the interposer 200 may be formed on the upper surface of the encapsulating material 110.

The interposer 200 may be formed in any of a variety of manners, non-limiting examples of which are provided herein. For example, in an example implementation, a preformed interposer 200 (e.g., an interposer Printed Circuit Board (PCB), an interposer formed from a silicon wafer in a back end-of-line process, etc.) may be stacked on the upper surface of the encapsulating material 110 and electrically connected to the stacking terminals (e.g., by soldering, conductive adhesive attachment, etc.). For example, the stacking terminals 122 may be conductively attached (e.g., soldered, adhered, fused, etc.) to lands at a lower surface of the preformed interposer.

In another example implementation, the interposer 200 may be constructed on the lower semiconductor package 100. For example, conductive traces (which may also be referred to herein as re-wiring lines or redistribution lines) may be conductively connected to the stacking terminals 122 and arranged to extend to desired positions on the upper surface of the encapsulating material 110.

For example, as illustrated in diagram 300D of FIG. 3, forming the interposer 200 may comprise applying a first dielectric layer 115 to the surface of the encapsulating material 110. The first dielectric layer 115, which may also be referred to as a passivation layer, may comprise any of a variety of materials, non-limiting examples of which are provided herein. For example, the first dielectric layer 115 may comprise an organic dielectric material (e.g., bismaleimidetriazine (BT), phenolic resin, polyimide (PI), benzo cyclo butene (BCB), poly benz oxazole (PBO), epoxy and equivalents thereof and compounds thereof, etc.). Also for example, the first dielectric layer 115 may comprise an inorganic dielectric material (e.g., silicon oxide, silicon nitride, etc.). The first dielectric layer 115 may be formed in any of a variety of manners, non-limiting examples of which are provided herein. For example, the first dielectric layer 115 may be formed by chemical vapor deposition (CVD), etc. Note that in a scenario in which the top surface of the semiconductor die 104 is exposed from the encapsulating material 110, the first dielectric layer 115 may be formed on (e.g., directly on, over an intervening oxide layer, etc.) such top surface.

A portion of the first dielectric layer 115 may, for example, be removed to expose upper surfaces of the stacking terminals 122 for subsequent connection to conductive traces. Such removal may be performed in any of a variety of manners, for example using a photoresist and etching process. Note that in an alternative implementation, the first dielectric layer 115 may be formed having apertures through which the stacking terminals 122 are exposed.

Conductive traces 116 of the interposer 200 may then be formed on the first dielectric layer 115 and electrically connected to the stacking terminals 122. The conductive traces 116 may, for example, run laterally inward toward a center area of a respective package (e.g., over a respective semiconductor die 104 in a fan-in configuration) and/or run outward toward a perimeter of a respective package (e.g., in a fan-out configuration). The conductive traces 116 may be formed in any of a variety of manners, non-limiting examples of which are provided herein. For example, the conductive traces 116 may be formed by sputtering and/or electro-plating.

Forming the interposer 200 may also, for example, comprise forming a second dielectric layer 117 on the conductive traces 116 and/or the first dielectric layer 115. Ends of the conductive traces 116, for example those away from ends of the conductive traces 116 at the stacking terminals 122, may be exposed from the second dielectric layer 117, for example as pad locations for subsequent connection with interconnection structures of a top package. The second dielectric layer 117, which may also be referred to herein as a passivation layer, may share any or all material characteristics with the first dielectric layer 116 and/or may be formed by a same or different process.

As shown at diagram 300E, the carrier 130 may then, for example, be removed from the bottom surfaces of the encapsulating material 110 and the boards 120. Such removal may be performed in any of a variety of manners, non-limiting examples of which are provided herein. For example, depending on the nature of the adhesion between the carrier 130 and the objects adhered thereto (e.g., the boards 120, encapsulating material 110, etc.), any of a variety of temperature, chemical, and/or physical techniques may be utilized to separate the carrier 130 from the encapsulating material 110 and the boards 120. For example, non-destructive techniques may be utilized to break the adhesion between the carrier 130 and the encapsulating material 110 and the boards 120, without damaging the carrier 130, which would allow for re-use of the carrier 130.

After the carrier 130 is separated from lower surfaces of the respective individual boards 120 and a lower surface of the encapsulating material 110, interconnection structures 109 (e.g., conductive balls, solder balls, conductive pillars or posts, conductive bumps, etc.) may be attached to lands on the lower surfaces of the boards 120.

Additionally, after an upper semiconductor package 300 is stacked on the interposer 200 (or before such stacking), the resulting structure may be singulated along or between the singulation lines 124. For example, such singulation may be performed by any of a variety of techniques (e.g., sawing, punching, cutting, snapping, etc.). For example, after such singulating is performed, a lateral side surface of a singulated package may comprise coplanar lateral surfaces of a board 120, the encapsulating material 110, and/or an interposer 200 (e.g., any or all of the dielectric and/or conductive layers thereof).

Figure 4:
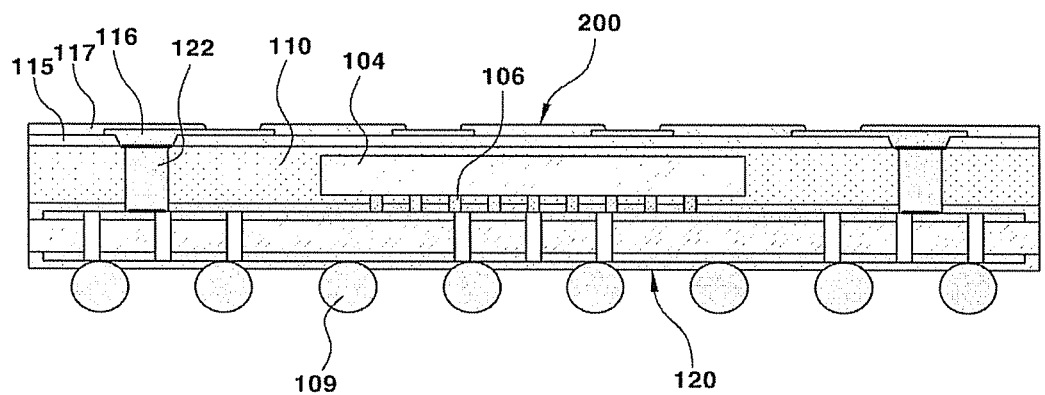
FIG. 4 is a cross-sectional view of an example semiconductor package, in accordance with various aspects of the present disclosure.

For example, a saw may cut through the encapsulating material 110, and/or may also cut through one or more layers of the interposer 200, and/or may also cut through perimeter edges of the board 120. An example configuration in which lateral side surfaces of the board 120, the encapsulating material 110, and the interposer 200 are coplanar is shown at FIG. 4. Note that the board 120 need not be sawn during singulation, for example resulting in a structure in which after singulation, side lateral surfaces of the board 120 are covered with the encapsulating material 110, and the side lateral surfaces of the encapsulating material 110 and/or the interposer 200 are coplanar. An example configuration in which lateral side surfaces of the encapsulating material 110 and the interposer 200 are coplanar, and in which the lateral surfaces of a board 120 is covered by the encapsulating material 110 is shown at the bottom of FIG. 3.

Figure 5:
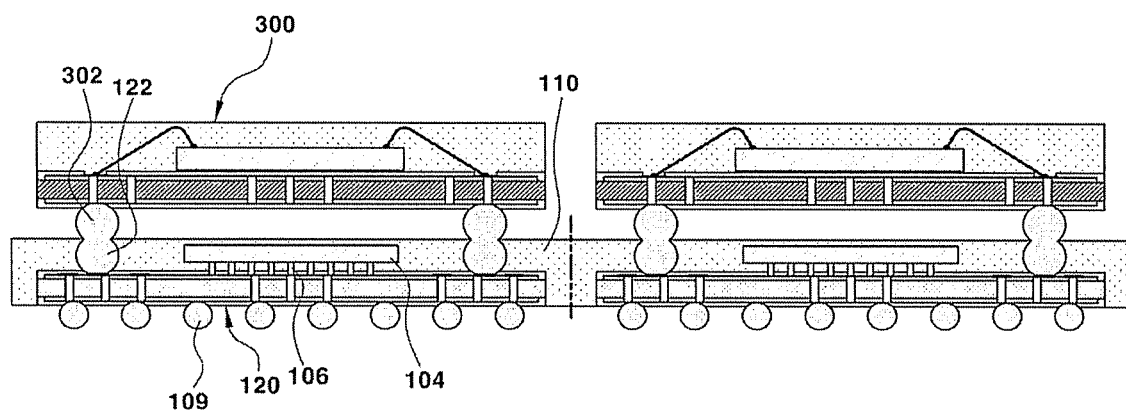
FIG. 5 is a cross-sectional view of an example semiconductor package, in accordance with various aspects of the present disclosure.

FIGS. 4 and 5 are cross-sectional views illustrating example forms of a semiconductor device package (e.g., a PoP type package) manufactured in accordance with various aspects of the present disclosure. The example semiconductor device packages illustrated in FIGS. 4 and 5 may share any or all characteristics with the other packages shown and discussed herein.

For example, as illustrated in FIG. 4, when the stacking terminals 122 are attached to the conductive pattern exposed from the rim region of each individual board 120 corresponding to the peripheral region around the semiconductor die 104, the stacking terminals 122 may be attached using copper stud bumps.

Also for example, as illustrated in FIG. 5, instead of forming the interposer, the upper semiconductor package 300 may be directly conductively stacked on and connected to the stacking terminals 122 exposed through the encapsulating material 110. For example, when a general ball grid array semiconductor package is adopted as the upper semiconductor package 300, as input and output terminals 302 attached to a lower surface of the upper semiconductor package 300 are directly conductively connected to the stacking terminals 122, the upper semiconductor package 300 may be stacked on the lower semiconductor package 100 without the interposer.

As described herein, in accordance with various aspects of the present disclosure, in an implementation in which only good-quality individual boards are utilized, for example as singulated from a strip-board, a series of package manufacturing processes may be performed using a carrier as a support means for use in, for example, an attachment process of individual boards and dies. In this way, it is possible to reduce and/or prevent the generation of defective packages caused when defective individual boards of a strip-board are utilized in production.

As is apparent from the description herein, various aspects of the present disclosure provide many advantages. First, for example, as good-quality individual boards, and not defective boards, are selected by performing defect inspection on a strip-board and only the good-quality individual boards are used for package manufacturing, it is possible to reduce and/or eliminate defects of a completed package due to defective boards. Secondly, as a plurality of packages may be manufactured in a group, for example like as a strip-board, by using a carrier having a predetermined thickness to support individual boards, it is possible to maintain a desired production yield. Thirdly, since the carrier having a predetermined thickness supports and firmly holds the respective individual boards, it is possible to reduce and/or prevent warpage of the boards that may occur in a series of package manufacturing processes such as, for example, die attachment and molding processes performed with a strip-board.

In summary, various aspects of this disclosure provide a method for manufacturing a semiconductor device package, for example a Package-on-Package (PoP) type package. As non-limiting examples, various aspects of this disclosure provide a method for increasing manufacturing yield and/or reducing warpage in semiconductor device packages. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. A method of manufacturing semiconductor packages, the method comprising:
   providing package substrates on a carrier, wherein a respective bottom side of each package substrate is attached to a top side of the carrier;
   attaching semiconductor dies to the package substrates such that each package substrate comprises a semiconductor die attached to its top side;
   providing conductive structures on the package substrates such that each package substrate comprises a conductive structure on its top side;
   covering the package substrates, the semiconductor dies, and the conductive structures with an encapsulating material to form encapsulated package substrates;
   exposing top sides of the conductive structures by removing a portion of the encapsulating material; and
   singulating the encapsulated package substrates;
   wherein exposing the top sides of the conductive structures comprises planarizing a top side of the encapsulating material; and
   wherein, after planarizing the top side of the encapsulating material, top sides of the semiconductor dies remain covered by the encapsulating material.

2. The method of claim 1, wherein attaching the semiconductor dies to the package substrates comprises attaching the semiconductor dies while the package substrates are attached to the carrier.

3. The method of claim 1, wherein singulating cuts through the encapsulating material between package substrates of the encapsulated package substrates without cutting a package substrate of the encapsulated package substrates.

4. The method of claim 1, wherein each conductive structure comprises copper.

5. The method of claim 1, wherein planarizing the top side of the encapsulating material thins the encapsulating material and removes conductive material from the top sides of the conductive structures.

6. The method of claim 1, wherein providing conductive structures on the package substrates comprises attaching balls to the package substrates.

7. The method of claim 1, further comprising forming interposers on a top side of the encapsulating material such that each interposer is coupled to a respective package substrate via its conductive structure.

8. The method of claim 7, wherein singulating cuts through the interposers and forms lateral sides that connect an interposer top side to an interposer bottom side of each interposer.

9. The method of claim 8, wherein:
   each package substrate comprises lateral sides that connect its top side to its bottom side; and
   singulating cuts through the encapsulating material between package substrates of the encapsulated package substrates such that the encapsulating material remains on the lateral sides of each package substrate of the encapsulated package substrates.

10. The method of claim 1, wherein providing conductive structures on the package substrates occurs before attaching semiconductor dies to the package substrates.

11. The method of claim 1, wherein, after planarizing the top side of the encapsulating material, interconnection structures coupled to the semiconductor dies remain laterally surrounded by the encapsulating material.

12. A method of manufacturing semiconductor packages, the method comprising:

providing an array of encapsulated package structures, wherein the encapsulated package structures comprise:
- printed circuit boards;
- semiconductor dies coupled to the printed circuit boards such that each printed circuit board comprises a semiconductor die attached to its top side;
- stacking terminals coupled to the printed circuit boards such that each printed circuit board comprises a stacking terminal attached to its top side; and
- encapsulating material that encapsulates the printed circuit boards, the semiconductor dies, and the stacking terminals; and singulating the encapsulated package structures.

13. The method of claim 12, wherein singulating cuts through the encapsulating materials between encapsulated package structures without cutting a printed circuit board of the encapsulated package structures.

14. The method of claim 12, further comprising planarizing a top side of the encapsulating material.

15. The method of claim 14, wherein planarizing the top side of the encapsulating material thins the encapsulating material and exposes top sides of the stacking terminals.

16. The method of claim 14, wherein planarizing the top side of the encapsulating material thins the encapsulating material and flattens the tops sides of the stacking terminals.

17. The method of claim 12, further comprising forming interposers on a top side of the encapsulating material such that each interposer is coupled to a respective printed circuit board via its stacking terminal.

18. The method of claim 17, wherein singulating cuts through the interposers and forms lateral sides that connect an interposer top side to an interposer bottom side of each interposer.

19. The method of claim 18, wherein:
- each printed circuit board comprises lateral sides that connect its top side to its bottom side; and
- singulating cuts through the encapsulating material between each encapsulated package structure such that the encapsulating material remains on the lateral sides of each printed circuit board of the encapsulated package structures.

20. The method of claim 12, wherein:
- each printed circuit board comprises lateral sides that connect its top side to its bottom side; and
- singulating cuts through the encapsulating material between the encapsulated package structures such that the encapsulating material remains on the lateral sides of each printed circuit board of the encapsulated package structures.

* * * * *